United States Patent
Neubauer

(10) Patent No.: US 7,304,519 B2
(45) Date of Patent: Dec. 4, 2007

(54) DATA LATCH, MASTER/SLAVE FLIPFLOP AND FREQUENCY DIVIDER CIRCUIT

(75) Inventor: Volker Neubauer, Linz (AT)

(73) Assignee: Infineon Technologies AG, Munich (DE)

( * ) Notice: Subject to any disclaimer, the term of this patent is extended or adjusted under 35 U.S.C. 154(b) by 125 days.

(21) Appl. No.: 11/293,381

(22) Filed: Dec. 2, 2005

(65) Prior Publication Data

US 2006/0145743 A1 Jul. 6, 2006

(30) Foreign Application Priority Data

Dec. 3, 2004 (DE) .................. 10 2004 058 409

(51) Int. Cl.
*H03K 21/00* (2006.01)
(52) U.S. Cl. .................. 327/203; 327/202; 327/115; 327/117
(58) Field of Classification Search .................. None
See application file for complete search history.

(56) References Cited

U.S. PATENT DOCUMENTS

| | | | | |
|---|---|---|---|---|
| 5,907,589 A | * | 5/1999 | Koifman et al. ............. | 377/47 |
| 6,127,867 A | * | 10/2000 | Coughlin et al. ........... | 327/202 |
| 6,400,199 B1 | * | 6/2002 | Liu et al. .................... | 327/202 |
| 6,515,528 B1 | | 2/2003 | Tohsche | |
| 2003/0112047 A1 | * | 6/2003 | Dike .......................... | 327/202 |
| 2006/0132209 A1 | * | 6/2006 | Meltzer et al. ............. | 327/202 |

FOREIGN PATENT DOCUMENTS

EP 0 768 758 A1 4/1997

* cited by examiner

*Primary Examiner*—Tuan T Lam
(74) *Attorney, Agent, or Firm*—Eschweiler & Associates, LLC

(57) ABSTRACT

A data latch contains a supply connection, a reference ground potential connection and a data input. The input side of an inverter is connected to the data input, and it is coupled via a first switching device to the supply connection, and via a second switching device to the reference ground potential connection. Furthermore, a first multivibrator circuit having transistors of a first conductance type is provided, and is coupled to the supply connection. A second multivibrator circuit having transistors of a second conductance type is coupled to the reference ground potential connection. The transistors in the first and second multivibrator circuits in the data latch are connected to one another on the output side at a first node and at a second node, with the first node being connected to one output of the inverter, and the second node forming an output tap.

11 Claims, 7 Drawing Sheets

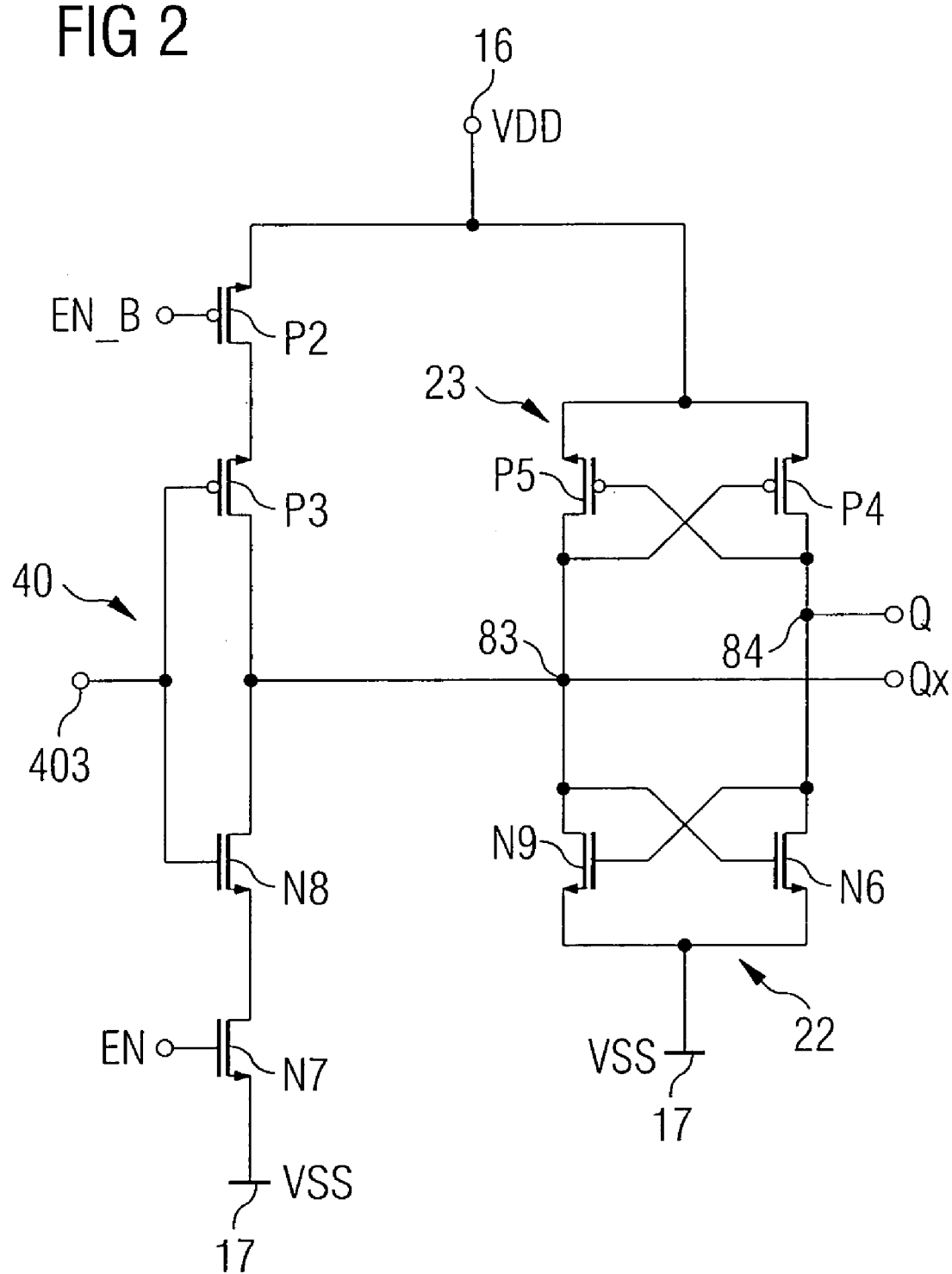

(PRIOR ART) LO SIGNAL (CLK)

(PRIOR ART) DIVIDER OUTPUT SIGNAL (LOQ)

(PRIOR ART) OUTPUT BUFFER SIGNAL (PRIOR ART) DIVIDER SUPPLY CURRENT

DATA LATCH, MASTER/SLAVE FLIPFLOP AND FREQUENCY DIVIDER CIRCUIT

REFERENCE TO RELATED APPLICATIONS

This application claims the benefit of the priority date of German application DE 10 2004 058 409.5, filed on Dec. 3, 2004, the contents of which are herein incorporated by reference in their entirety.

FIELD OF THE INVENTION

The present invention relates to a data latch, a master/slave flipflop and a frequency divider circuit.

BACKGROUND OF THE INVENTION

Master/slave flipflops in the form of so-called latches are required for a large number of applications. By way of example, they may be used as flipflops with feedback in the form of a frequency divider circuit in a transmission path for radio-frequency signals. They are used to divide a signal by a factor of two, and can also be used to produce signals with a phase shift of 90°. One example of a transmission path with a frequency divider circuit which is suitable for the GSM mobile radio standard is shown in prior art FIG. 5. The GSM mobile radio standard uses GMSK modulation for modulation of signals. In this case, the information to be transmitted is coded only in the phase and/or the frequency of the signal. The amplitude of the modulated signal does not vary in this case.

In modern circuit designs for phase modulation or frequency modulation, a modulation signal is supplied directly to one input MODIN of the phase locked loop PLL. The phase locked loop varies the output signal OUT from a voltage controlled oscillator VCO in accordance with the modulation signal at the modulation input MODIN. The output signal from the voltage controlled oscillator in transmitters of this design is accordingly modulated directly with the data to be transmitted.

In order to produce the output signal at the correct transmission frequency in the GSM800/900 and/or GSM1800/1900 frequency band, the frequency of about 4 GHz of the output signal OUT from the voltage controlled oscillator VCO is divided by a downstream frequency divider circuit or circuits. It is then amplified to the desired output power. In order to minimize the phase noise in the overall transmission path, it is expedient for the signal waveform throughout the entire signal path, and hence also the output signal, to have as square a waveform as possible. At the same time, the duty ratio of the output signal should have the value 0.5 or 50% in order in this way to obtain the maximum output power at the appropriate carrier frequency. If the duty ratio is not 50%, harmonic frequency components are produced, which reduce the output power of the useful signal at the carrier frequency.

A local oscillator output signal OUT with an incorrect duty ratio is compensated for in the frequency divider circuits, provided that they do not themselves produce an error in the duty ratio.

Prior art FIG. 7 shows one known frequency divider, which is formed by a master/slave flipflop. The flipflop circuit in each case contains two charge buffers 100, which are in the form of differential amplifiers. These are coupled to bistable multivibrator circuits 200, and amplify the state of the respective downstream multivibrator circuit.

In the known exemplary embodiment, both the differential amplifier transistors and the transistors in the bistable multivibrator circuits are coupled via resistors 99 to the supply potential VDD at the supply connection 16. The multivibrator circuits and the amplifiers are activated alternately via a push-pull signal at the clock inputs 15 and 14.

During operation of the frequency divider circuit, one of the two transistors in the respective multivibrator circuit is charged to an appropriate supply potential via the resistors 99 on a rising edge of a clock signal which is applied to one of the clock inputs 14 or 15. The respective gate/source capacitance together with the upstream resistance results in a charging time which leads to a change in the duty ratio of the output signal.

Prior art FIGS. 6A-6D show various graphs in order to illustrate this problem. The graph element in FIG. 6B shows the output voltage of the output 12a plotted against time. As can be seen, the charging time from a low level to a high level has a different duration depending on the resistance values. In contrast to this, the fall time is approximately the same.

The rise time of the output signal in the graph element of FIG. 6B can be approximated by an exponential function with a time constant which is governed by the value of the resistance and by the corresponding gate/source capacitance in the multivibrator circuits 200 in the master/slave flipflop.

In order to improve the flank grading, which leads to an improvement in the duty ratio, it is possible to reduce the value of the resistor 99. The embodiments illustrated in the FIGS. 6B and 6C show three different resistances. These lead to the duty ratio being improved from 57% to 51%. In contrast, the graph in FIG. 6D, however, shows a considerable rise in the supply current, from 18 to 27 mA.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a data latch which allows a rapid rise time, with small power consumption at the same time. The aim of a further aspect is to provide a flipflop, which is also suitable for use as a frequency divider.

According to one embodiment of the invention, a data latch contains a data input as well as an inverter, which is connected to it. On the output side, the inverter is coupled to a first multivibrator circuit composed of transistors of a first conductance type, and to a second multivibrator circuit composed of transistors of a second conductance type. The first and second multivibrator circuits form a buffer, with the transistors being connected to one another on the output side at a first node and at a second node. The first node is in this case connected to one output of the inverter.

The complementary structure of a buffer which is downstream from the inverter results in a switching speed improvement over conventional latches. One aspect of the invention relates to the complementary structure of the first and second multivibrator circuits. The multivibrator circuits are thus composed of transistors of different conductance type. The multivibrator circuit may in this example be designed in such a way that a control connection of one of the transistors is coupled to an output connection of the respective other transistor.

In another embodiment of the invention, a master/slave flipflop can be formed from the latch. A third multivibrator circuit and a fourth multivibrator circuit can be provided in addition to the inverter, the first and the second multivibrator circuit for this purpose. The third and the fourth multivibrator circuits respectively have transistors of a first and a second conductance type. Furthermore, the flipflop contains a second inverter as well as a third inverter, which are connected via a third and a fourth switching device to the supply connection and to a reference ground potential connection, respectively. On the input side, the second inverter is connected to the first node, and the third inverter is connected to the second node. On the output side, the second and third inverters are connected to the third and fourth multivibrator circuits.

The design with a complementary structure in the master/slave flipflop leads to a considerable switching speed improvement, and thus to higher clock and switching frequencies. The first as well as the second and third inverters can thus be driven by the same clock signal. A data item applied to the input side can thus be stored in a first buffer in a first clock cycle. This data item is then transferred to a second buffer when a clock edge occurs. In this case, the first buffer is formed by the first and second multivibrator circuits, and the second buffer is formed by the third and fourth multivibrator circuits.

In another embodiment of the invention, a master/slave flipflop has a supply connection, a ground connection, a first multivibrator circuit and a second multivibrator circuit. The first multivibrator circuit is designed with transistors of a first conductance type, which are coupled to the supply connection. The second multivibrator circuit is designed with transistors of a second conductance type, and is coupled to the ground connection. The first and second multivibrator circuits are arranged with respect to one another, and are connected to one another at a first node and at a second node. A first inverter and a second inverter are connected by means of their supply connections between a first and a second switching device for coupling to the supply, and are connected by their inputs to, in each case, one of the two nodes.

In another embodiment, a third multivibrator circuit is provided, having transistors of the first conductance type, as well as a fourth multivibrator circuit, having transistors of the second conductance type. The third multivibrator circuit is coupled to the supply connection, and the fourth multivibrator circuit is coupled to the ground connection. The third and fourth multivibrator circuits are likewise arranged in parallel and are in each case connected to one another at a third and at a fourth node. A third and a fourth inverter are connected by means of their supply connections between a third and a fourth switching device. One input of the third and of the fourth inverter is respectively connected to the third and to the fourth node. Finally, the first inverter is connected on the output side to the third node, the second inverter is connected on the output side to the fourth node, the third inverter is connected to the first node, and the fourth inverter is connected on the output side to the second node.

This embodiment results in a master/slave flipflop in which the gate-source capacitances in the multivibrator circuits are no longer charged and discharged via resistors but via the respective inverter. The charging time of the gate-source capacitances of the transistors in the multivibrator circuit is considerably reduced. The switching speed of the master/slave flipflop according to the invention is thus increased. The complementary structure and arrangement of the multivibrator circuits reduces the steady-state power consumption within the circuit.

In one embodiment, the multivibrator circuits can also be connected, in each case via a switching device, to the respective supply or reference ground potential connections. The multivibrator circuits can thus also be selectively isolated from a power supply.

A first clock input as well as a second clock input are provided in a more advanced aspect of the invention. The first clock input is coupled to the first and the fourth switching devices, and the second clock input is coupled to the second and third switching devices. This results in a preferred manner in a frequency divider circuit which, when a first and a second signal, respectively, are supplied to the first and the second clock input, advantageously emits a frequency division with a division ratio of 50% at the outputs of the third and fourth inverters.

It is expedient for at least one of the multivibrator circuits to be designed with a first and a second transistor, whose source connections are connected to a common switching node. Their control connections are connected to sink connections of the respective other transistors, forming a cross-coupling.

In another embodiment of the invention, the first and the fourth switching device as well as the second and the third switching device respectively have at least one switching transistor, whose control connections are connected to the first and to the second clock input, respectively. In this case, it is expedient for the at least one switching transistor to have at least one of the switching devices of the same conductance type as the transistors in the multivibrator circuit which is connected to the at least one switching device.

A further aspect of the invention relates to the inverters. The at least one of the inverters may thus contain two series-connected transistors of different conductance type. One transistor in the inverter is in this case of the same conductance type as the switching transistor which is connected to it in the switching device. In an alternative embodiment, one transistor in the inverter is of the same conductance type as one transistor in the multivibrator circuit which is in each case connected by means of the inverter to a switching device.

The master/slave flipflop according to the invention may be formed using both field-effect transistors and bipolar transistors. In the latter case, the source connections can be replaced by emitter connections, and the drain connections can be replaced by collector connections. p-channel field-effect transistors can be replaced by pnp bipolar transistors, and n-channel field-effect transistors can be replaced by npn bipolar transistors.

The master/slave flipflop according to the invention can be used in one manner as a frequency divider circuit for radio-frequency signals. In this case, the radio-frequency signals are supplied to the first and to the second clock input.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text with reference to one exemplary embodiment and with the assistance of the drawings, in which:

FIG. 2 is a schematic diagram illustrating one exemplary embodiment of a D latch with multivibrator circuits in a complementary configuration.

DETAILED DESCRIPTION OF THE DRAWINGS

Figure 1A:
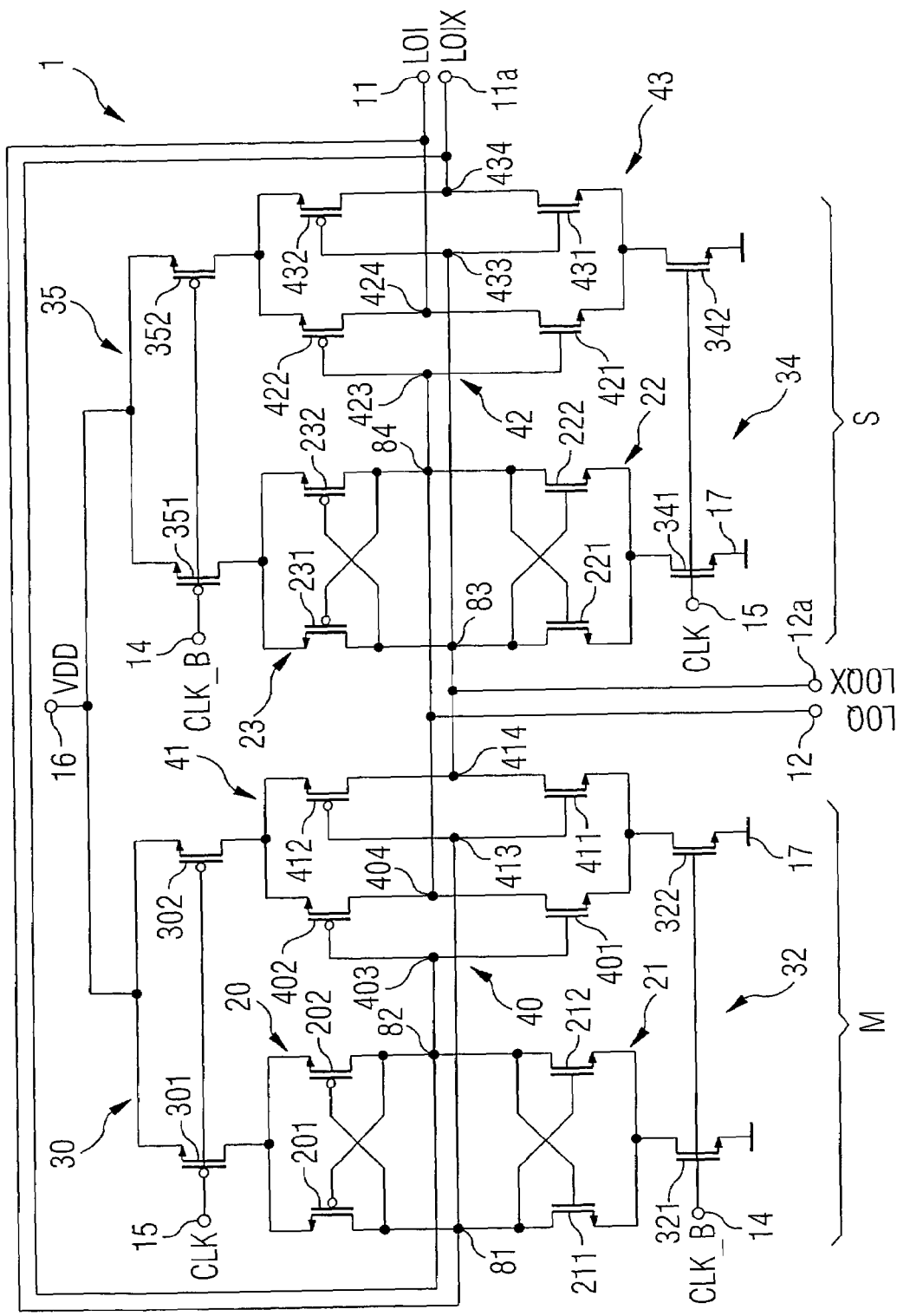
FIG. 1A is a schematic diagram illustrating a first exemplary embodiment of a master/slave flipflop according to the invention, as a frequency divider circuit.

FIG. 2 shows a D latch in a complementary configuration, which allows considerably faster switching times than a D latch based on resistors. The illustrated latch contains an inverter circuit 40, which has a p-channel field-effect transistor P3 as well as a series-connected n-channel field-effect transistor N8. Their control connections are jointly connected to a signal input 403, which forms the input at the latch. On the output side, the inverter circuit 40 is coupled to a buffer with two mutually complementary multivibrator circuits 22 and 23.

In particular in this embodiment, the first multivibrator circuit 22 has two n-channel field-effect transistors, which are connected to a reference ground potential connection 17 at a common node. In a corresponding manner, the second multivibrator circuit 23 has two p-channel field-effect transistors P4 and P5. These are on the one hand jointly connected at the supply potential connection 16, and are on the other hand connected by their respective second connections in the respective output nodes 83 and 84 to the respective second connections of the transistors in the first multivibrator circuit 22. In other words, the output sides of the two multivibrator circuits 22, 23 are connected to one another at the nodes 83 and 84. The node 83 at the same time also forms the output tap for the inverted signal Qx. The two multivibrator circuits 23 and 24 are used for temporary storage of the signal that is applied to the inverter 40.

Furthermore, the D latch has a switching device which is used to activate and to deactivate the inverter 40. For this purpose, the drain connection of the field-effect transistor P3 is coupled via a further field-effect transistor P2 to the supply potential connection 16. In a corresponding manner, a transistor N7 is connected between the reference ground potential connection 17 and the connection of the transistor N8 in the inverter 40. The control connections of the two transistors N7 and P2 are supplied with an activation signal EN and, respectively, with a signal EN_B, which is the inverse of the signal EN. These respectively activate and deactivate the inverter 40. An input signal which is supplied to the inverter 40 can thus be temporarily stored in the complementary multivibrator circuits 22 and 23, and the inverter can then be deactivated again.

The signals EN and EN_B thus respectively switch the latch to the read mode, and connect the data input 403 transparently to the output 84. If the signal EN represents a logic "0" and the signal EN_B a logic "1", the latch is in the storage state. When the logic levels of the signals EN and EN_B are complementary to this, the data input is transparently connected to the output. The complementary configuration allows the D latch to switch very quickly.

Figure 3:
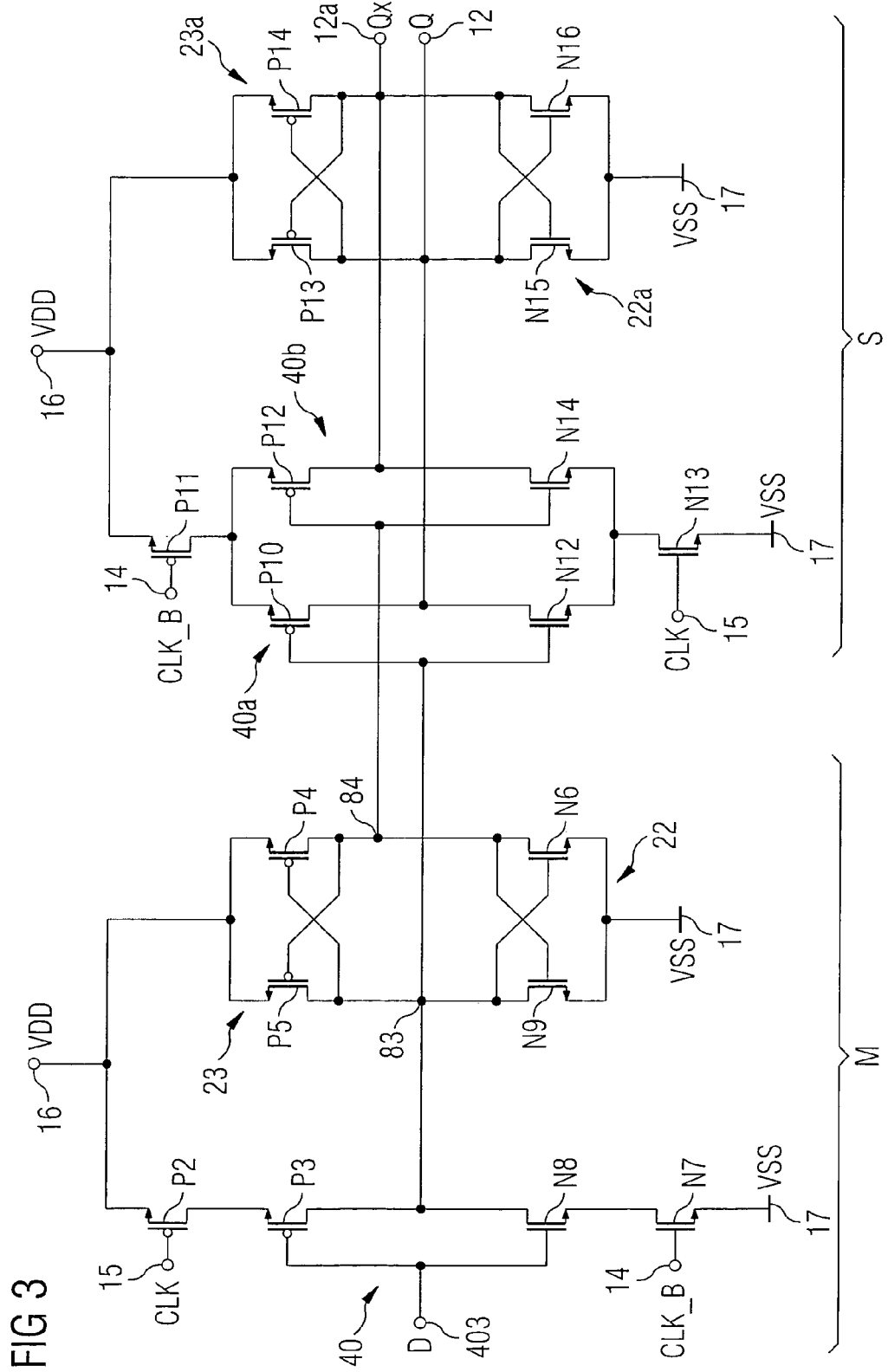
FIG. 3 is a schematic diagram illustrating a masters/slave flipflop with a D latch.

FIG. 3 shows a refinement of a fast master/slave flipflop which is provided with the latches illustrated in FIG. 2. In this embodiment, the output nodes 83, 84 of the buffer in the first latch are coupled to data inputs of two further inverter circuits 40a and 40b. The two inverter circuits together with a further inverter circuit composed of two mutually complementary multivibrator circuits 23a and 22a form a further flipflop. The flipflop shown on the left is in this case the master flipflop M and the flipflop shown on the right with the two inverter circuits formed by the field-effect transistors P10, P12 and N12, N14 is the slave flipflop S.

The two inverter circuits 23a, 22a in the slave flipflop are connected via a respective switching transistor P11 or N13 to the supply potential connection 16 or to the ground potential connection 17. The control connection of the transistor P11 is supplied with the inverted clock signal CLK_B at the connection 14. The clock signal CLK is applied to the control connection of the transistor N13. The clock inputs 14, 15 of the respective inverters in the master flipflop and slave flipflop are thus crossed over. In consequence, either the flipflop on the left or the flipflop on the right is activated, depending on the logic level of the supplied clock signal. If, for example, the clock input CLK is at a low level, then the flipflop on the left is active, and is switched to the read mode. A data word applied to the input 403 is stored in the two complementary multivibrator circuits 22, 23, and is emitted at the output taps 83, 84 as an inverted data item and a non-inverted data item, respectively. When a clock signal change takes place from a low level to a high level, that is to say from a logic "0" to a logic "1", the state which is stored in the multivibrator circuits 22, 23 is transferred to the flipflop on the right, and is produced at the output taps 12, 12a. The illustrated master/slave flipflop therefore stores the data item applied to the data input 403 on a rising edge of the clock signal CLK.

It is, of course, possible for the master/slave flipflop to be provided with an additional reset input, and thus to reset the outputs as well as the input.

Finally, FIG. 1A shows a master/slave flipflop refinement with feedback, which can be used as a frequency divider circuit. The master/slave flipflop 1 contains a first clock input 14 as well as a second clock input 15. An antiphase signal CLK, CLK_B is supplied to the two clock inputs. The present arrangement results in the frequency of the clock signal that is supplied being divided by a factor of 2, and being emitted at the outputs 11, 11a and 12, 12a. The signal which is emitted at the outputs is likewise an antiphase signal at half the frequency of the signal CLK, CLK_B applied on the input side to the clock inputs 14 and 15.

Furthermore, the master/slave flipflop produces a phase shift of 90° between the signals which can be tapped off at the outputs 11, 11a and 12, 12a.

As in the stated exemplary embodiment, the master/slave flipflop according to the invention can be used not only as a frequency divider circuit but also as a circuit in an I/Q modulator or I/Q demodulator for production of a signal with a phase shift of 90°. For this purpose, the master flipflop and the slave flipflop are constructed with in each case two inverters 40, 41 and 42, 43, as well as in each case two bistable complementary multivibrator circuits 20, 21 and 22, 23. In the following text, the expression complementary multivibrator circuits means two multivibrator circuits in which the transistors in one multivibrator circuits are of a different conductance type to the transistors in the other multivibrator circuit.

In detail, a supply connection 16 for supplying a supply potential VDD is connected in the master flipflop to a first switching device 30. The switching device 30 contains two p-channel field-effect transistors 301 and 302, whose source connections are connected to the connection 16. The control connections of the two field-effect transistors 301 and 302 are connected to the clock input 15 for supplying the clock signal CLK.

A second switching device 32 is likewise provided, and contains two n-channel field-effect transistors 321 and 322 whose source connections are connected to a reference ground potential connection 17. The control connections of the two field-effect transistors 321 and 322 are connected to the clock input 14 for supplying the clock signal CLK_B. The two clock signals CLK and CLK_B are in antiphase to one another.

The two inverters 40 and 41 are connected between the switching transistor 302 in the first switching device 30 and the switching transistor 322 in the second switching device 32. The inverters each have two series-connected transistors 402, 401, and 412, 411 respectively. In this case, the p-channel field-effect transistors 402 and 412 in the first inverter 40 and in the second inverter 41 are connected by their source connections to the drain connection of the switching transistor 302 in the first switching device 30. The source connections of the n-channel field-effect transistors 401 and 411 are connected in a corresponding manner to the switching transistor 322 in the second switching device 32. The control connections of the transistors 401 and 402 in the first inverter 40 are joined together at the node 403. In the same way, the control connections of the transistors 411 and 412 in the second inverter are connected to one another via the node 413.

The second switching transistor 301 in the first switching device 30 is connected by its output to the source connections of the p-channel field-effect transistors 201 and 202 in the first bistable multivibrator circuit 20. The two field-effect transistors 201 and 202 are cross-coupled by means of their control connections, and are thus connected to the drain connection of the respective other transistor.

The drain connections of the two transistors 201 and 202 in the first bistable multivibrator circuit 20 are connected to the drain connections of a second bistable multivibrator circuit 21, which is arranged in a complementary manner to this. The second bistable multivibrator circuit 21 has the two n-channel field-effect transistors 211 and 212, whose control connections are connected to the drain connections of the respective other transistor, likewise forming a cross-coupling. A first switching node 82 is connected to the tap 403 of the first inverter 40, and a second switching node 81 is connected to the tap 413 of the second inverter 41.

The slave flipflop in the flipflop circuit according to the invention is designed in a similar manner. This also contains two mutually complementary multivibrator circuits 22 and 23. The multivibrator circuit 22 is implemented using n-channel field-effect transistors 221 and 222, whose source connections are joined together at a common node, and whose control connections are connected to the drain connection of the respective other transistors. The second bistable multivibrator circuit 23 is implemented using p-channel field-effect transistors. On the source side, the transistors in the bistable multivibrator circuit 23 are connected to a third switching device 35 and, in particular, to a p-channel field-effect transistor 351 which, together with the second switching transistor 352, forms the third switching device 35. The control connections of the two switching transistors 351 and 352 are connected to the clock input 14. The source connections of the bistable multivibrator circuit 22 are connected in a similar manner via a switching transistor 341 in a fourth switching device 34 to the reference ground potential connection 17.

The slave flipflop likewise contains two inverters 42 and 43, which are connected between the switching devices 35 and 34. On the input side, the inverter 42 is connected to the tap 84 on the bistable multivibrator circuit, and to the output 404 of the first inverter 40. The input 433 of the fourth inverter 43 is connected to the tap 83 on the bistable multivibrator circuits 23 and 22 in the slave flipflop, and to the output 414 of the second inverter 41. In order to provide the feedback for the frequency divider circuit, the output of the third inverter 42 is connected at the clock output 11 and at the tap 82 on the bistable multivibrator circuits 20 and 21 in the master flipflop. The output 434 of the fourth inverter 43 is likewise connected to the output 11a and the tap 81 on the first and second bistable multivibrator circuits.

During operation of the circuit, the feedback results in the frequencies of the signals CLK and CLK_B applied on the input side being divided by a factor of 2. The bistable multivibrator circuits 20, 21 as well as 22, 23 in the master/slave flipflops according to the invention are respectively driven in antiphase by the clock signals CLK and CLK_B. The charging process of the gate/source capacitances takes place in the complementary manner by driving the inverters 40, 41 and 42, 43, respectively. Owing to the greater current flow through the inverters, the charging time is considerably reduced, so that the switching process is sped up.

In the illustrated embodiment, the switching devices 30, 32, 34 and 35 are formed using field-effect transistors of a different conductance type. It is likewise possible to implement them using the same conductance type in each case. In a situation such as this, the control connections must be connected to the respective other clock input. In addition, a single-ended signal can be supplied instead of an antiphase signal CLK and CLK_B. If, for example, the clock signal CLK is intended to be supplied to the switching devices 32 and 35 rather than the inverted clock signal CLK_B, the transistors in the switching device 32 should be in the form of p-channel transistors, and the transistors in the switching device 35 should be in the form of n-channel transistors.

As an alternative to this, it would also be possible to produce an inverted clock signal by means of an inverter. Accordingly, in one embodiment by way of example, the inputs of the switching devices 32 and 35 would be preceded by an inverter which inverts the clock signal. This makes it possible to use the design according to the invention even with a single-ended signal.

Figure 1B:
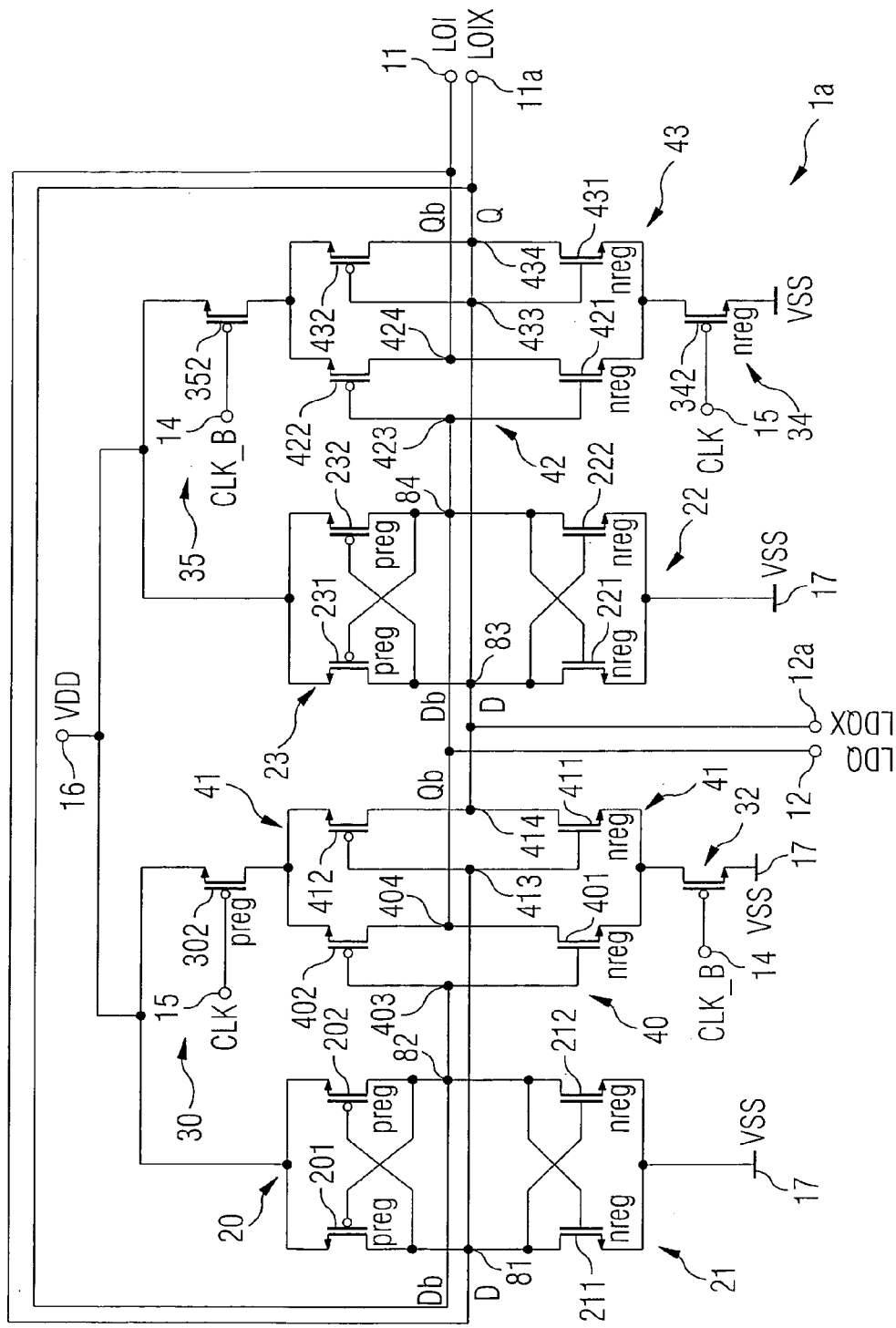
FIG. 1B is a schematic diagram illustrating a second exemplary embodiment of a master/slave flipflop according to the invention, as a frequency divider circuit.

A slightly modified embodiment of a master/slave flipflop as a frequency divider circuit is shown in FIG. 1B. Components having the same effect and function to those in FIG. 1A have the same reference symbols. In this refinement, only the two inverter circuits 40, 41 in the master flipflop as well as 42, 43 in the slave flipflop are coupled via the respective switching apparatuses 30, 32 and 35, 34 to the supply connections 16 and 17. The switches 30, 32, 34 and 35 each have one field-effect transistor, whose control connections can respectively be supplied with the clock signal CLK and the clock signal CLK_B, which has been inverted with respect to this. The multivibrator circuits 20 to 23, which operate as buffers, are in the present case connected directly to the supply connections 16 and 17, respectively. The switching response of the overall frequency divider circuit is not negatively influenced by this modification.

Figure 4:
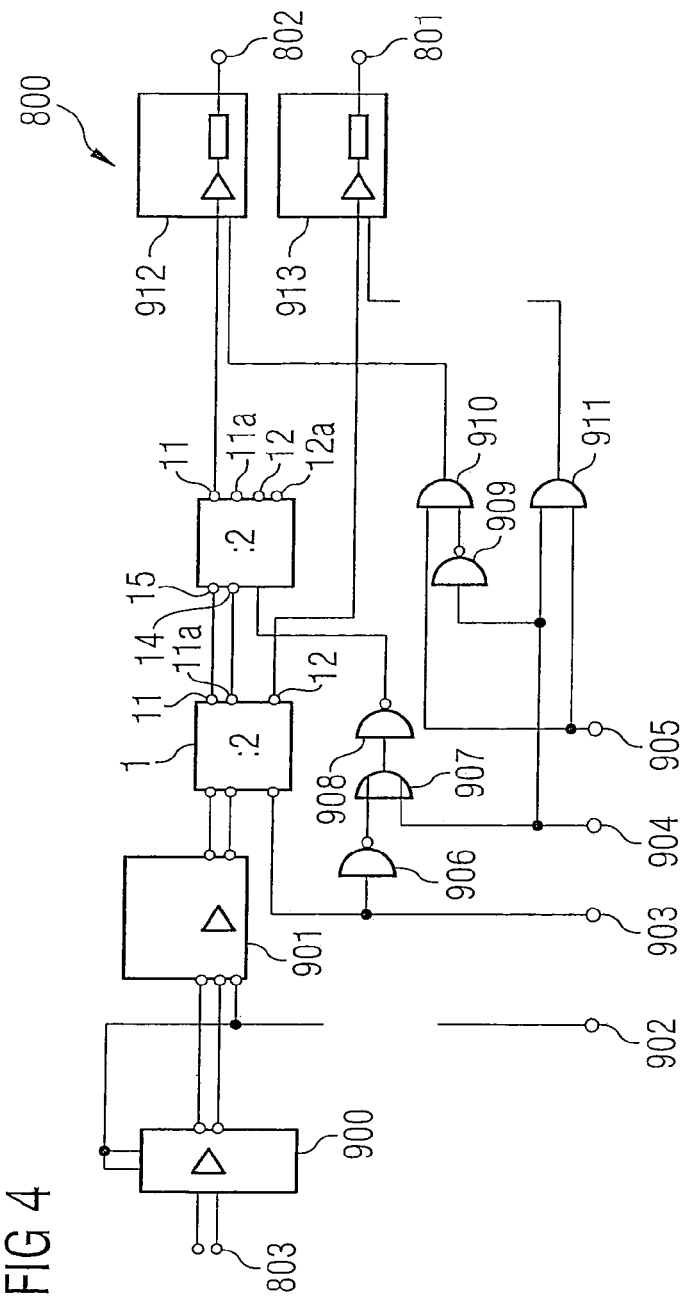
FIG. 4 is a schematic diagram illustrating one use of the master/slave flipflop, as a frequency divider circuit in a transmission path.
Figure 5:
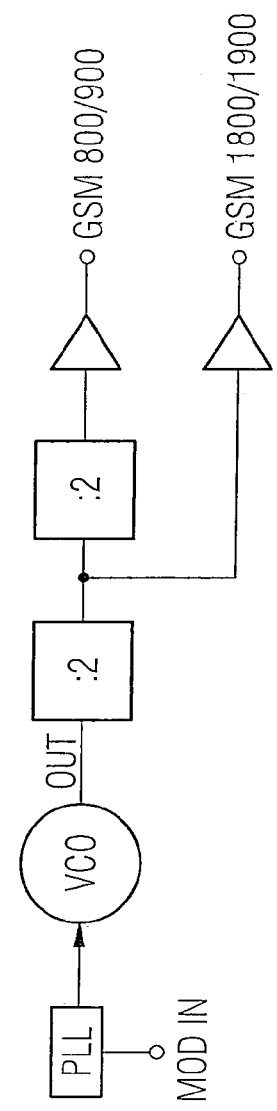
FIG. 5 is a prior art block diagram of a transmission path.
Figure 6A:
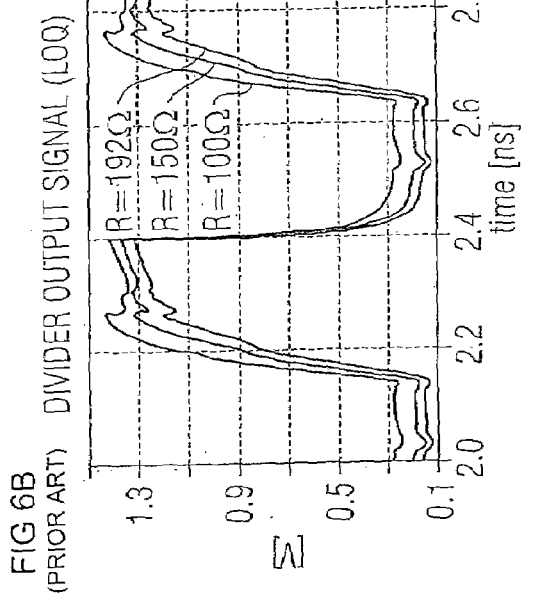
FIGS. 6A to 6D are prior art voltage/time graphs illustrating various signals in a known master/slave flipflop.
Figure 6B:
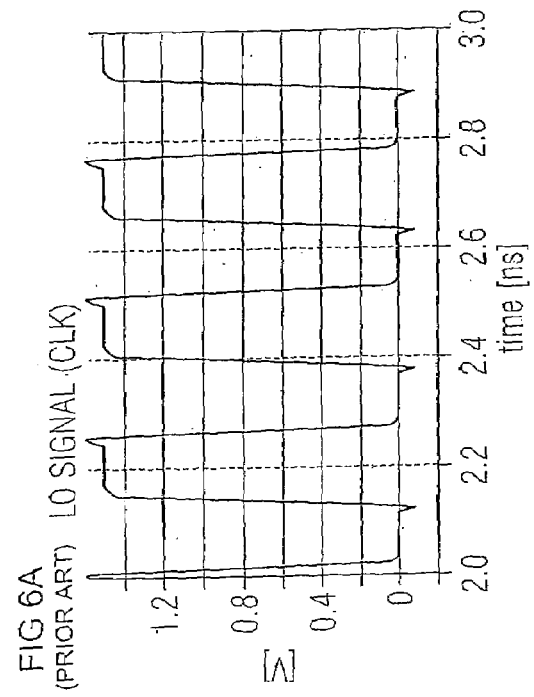
Figure 6C:
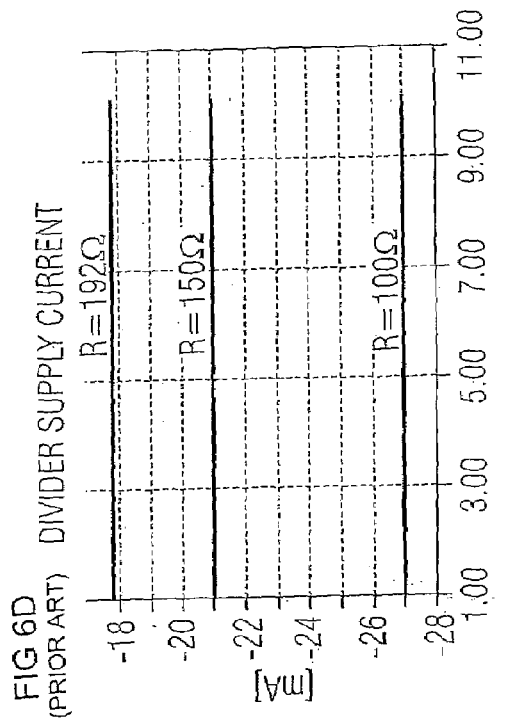
Figure 6D:
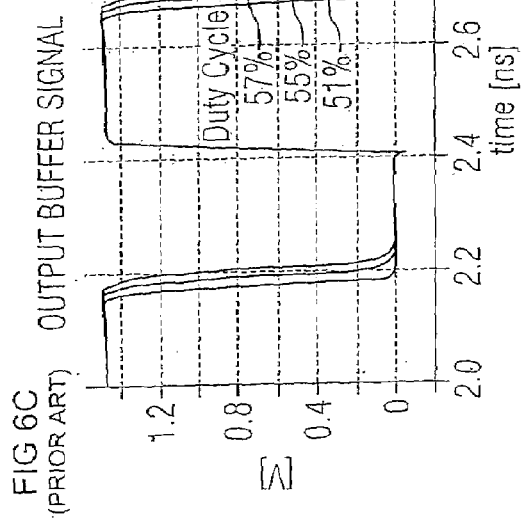
Figure 7:
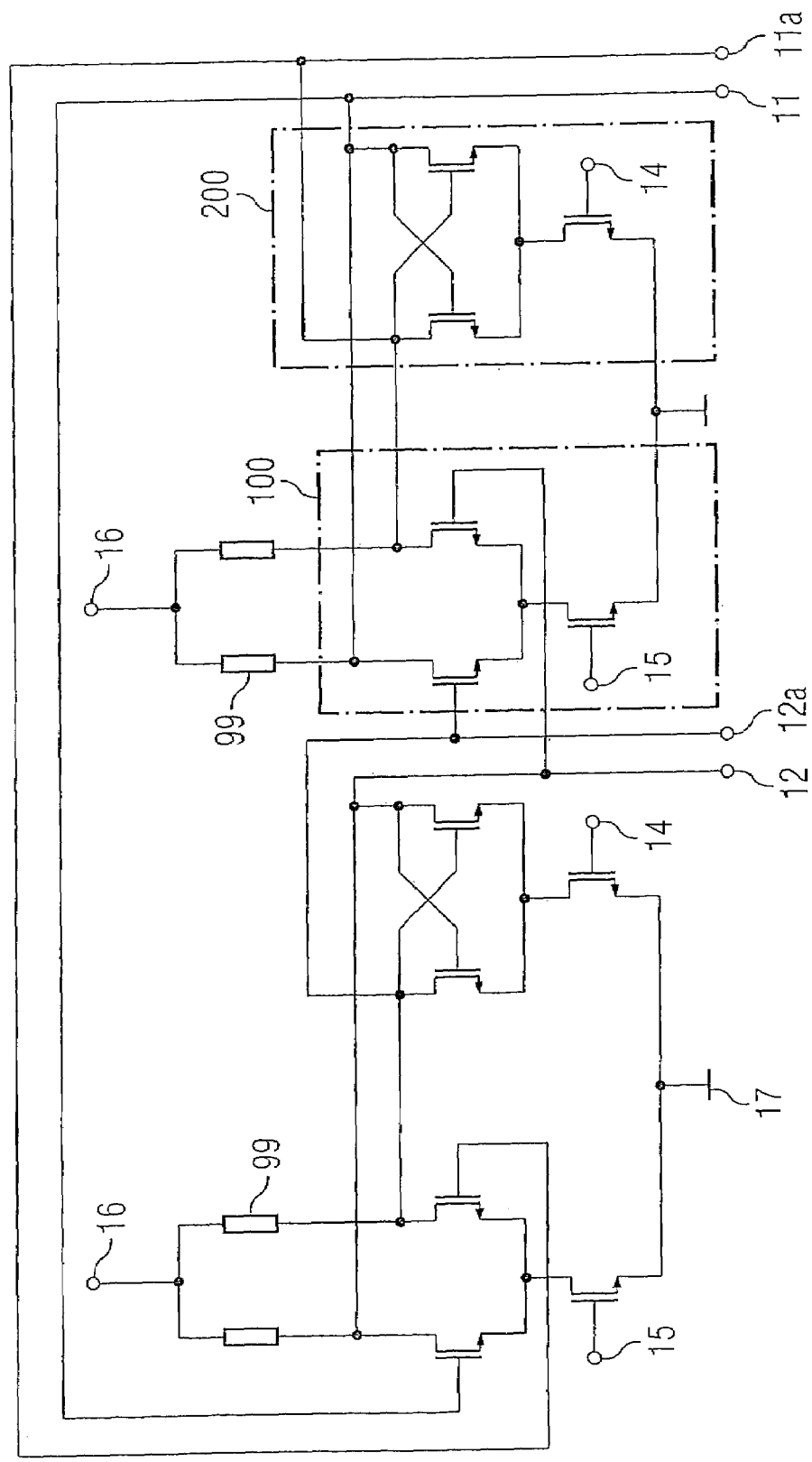
FIG. 7 is a schematic diagram illustrating a prior art master/slave flipflop.

FIG. 4 shows an exemplary embodiment of a transmission path 800 for use in a GSM transmitter. The phase-modulated and/or frequency-modulated signal is applied to the input 803 and contains the information to be transmitted, which has been modulated onto the oscillator signal in accordance with the requirements of the GSM mobile radio standard. The input 803 is connected to a first amplifier circuit 900. The amplifier circuit can be activated via an appropriate signal at a control input 902. The outputs of the amplifier circuit 900 lead to the clock inputs of a driver 901 which, together with the first control circuit 900, produces a square-wave pulse with steep rising and falling edges for subsequent frequency division.

The outputs of the driver 901 are connected to the inputs of the first frequency divider circuit. This frequency divider circuit is provided by the master/slave flipflop according to the invention. An activation signal is provided at the control input 903 in order to activate the frequency divider circuit. On the output side, the frequency divider emits a signal whose frequency has been divided by a factor of 2 at the outputs 11 and 11a, and supplies the signal to the inputs 14 and 15, respectively, of a second, downstream frequency divider. The second, downstream frequency divider is also formed by the master/slave flipflop according to the invention.

Furthermore, the output 12 leads to an input of a radio-frequency amplifier 913. The radio-frequency amplifier is designed to amplify signals in the frequency range from 1800 to 1900 MHz. On the output side, it emits the signal at the output 801. The output 11 of the second frequency divider is connected to the input of a second radio-frequency amplifier 912, which is designed to amplify signals in the frequency range from 800 to 900 MHz, that is to say in the GSM800/900 frequency band. The logic circuit that is also shown is intended for activation of the respective frequency dividers and the associated amplifier circuits. The control input 903 for activation of the first frequency divider is also connected to an inverter 906. The output of the inverter 906 leads to a first input of a logic OR gate 907, whose second input is connected to the control input 904. The control input 904 is used to supply an activation signal for the radio-frequency amplifier 913 and for deactivation of the second frequency divider. The output of the OR gate 907 is connected to one input of an inverter 908. The output of the inverter 908 leads to an activation input of the second frequency divider.

When the signals at the control inputs 903 and 904 are at a high level, both frequency dividers are activated. When the signal at the input 904 is at a low level, the second frequency divider is switched off, and the frequency-divided signal is emitted directly to the amplifier 913 for amplification.

Furthermore, the input 904 is connected to an inverter 909 and to a logic AND gate 911. The second input of the logic AND gate 911 leads to a further control input 904, which is likewise connected to a first input of a logic AND gate 910, whose second input is connected to the output of the inverter 909. The outputs of the respective logic AND gates 910 and 911 lead to activation inputs of the respective amplifiers 912 and 913.

Owing to the use of the inverter transistors for the process of charging the gate-source capacitances in the multivibrator circuits, the master/slave flipflop according to the invention can achieve a higher switching speed. In consequence, the duty ratio is improved, and the division speed of the overall circuit is increased.

The embodiment described here uses complementary field-effect transistors. In addition to the described CMOS technology, even higher switching speeds can be achieved by using bipolar transistors for the multivibrator circuits and/or for the inverters. For example the p-channel field-effect transistors in the multivibrator circuits and in the inverters can be replaced by appropriate pnp bipolar transistors. In the same way, the n-channel field-effect transistors can be replaced by npn bipolar transistors. When using bipolar transistors, the expression conductance type is understood as referring to the majority charge carriers. For example, a transistor of the p conductance type (p-channel) thus corresponds to a pnp bipolar transistor whose majority charge carriers are likewise of the p type.

It is likewise possible to combine field-effect transistors and bipolar transistors. The master/slave flipflop circuit according to the invention can be produced in the form of an integrated circuit in a semiconductor body. Because the steady-state power consumption is low and is in the region of a few milliamps, the area which is required for the transistors can be reduced so that, in contrast to known circuit designs, it is possible to achieve a space reduction of 40%.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A frequency divider circuit, comprising:
a supply connection;
a reference ground potential connection;
a first multivibrator circuit comprising transistors of a first conductance type, that are coupled to the supply connection;
a second multivibrator circuit comprising transistors of a second conductance type, that are coupled to the reference ground potential connection, wherein the first and the second multivibrator circuits are coupled to one another on the output side at a first node and at a second node;

a first inverter and a second inverter that are each connected by means of supply connections to a respective first and a second switching device, for coupling to the supply connection and to the reference ground potential connection, wherein one input of the first inverter is coupled to the second node, and wherein one input of the second inverter is coupled to the first node;

a third multivibrator circuit comprising transistors of the first conductance type, that are coupled to the supply connection;

a fourth multivibrator circuit comprising transistors of the second conductance type, that are coupled to the reference ground potential connection, wherein the third and the fourth multivibrator circuits are connected to one another on an output side at a third node and at a fourth node;

a third inverter and a fourth inverter, that are connected via respective third and a fourth switching device to the supply connection and to the reference ground potential connection, wherein an input of the third inverter is coupled to the fourth node, and wherein an input of the fourth inverter is coupled to the third node;

wherein the first inverter is coupled on an output side to the fourth node, the second inverter is coupled on the output side to the third node, the third inverter is coupled on the output side to the first node, and with the fourth inverter is coupled on the output side to the second node.

2. The frequency divider circuit of claim 1, wherein the first switching device is arranged between the transistors in the first multivibrator circuit and the supply connection, and wherein the second switching device is arranged between the transistors in the second multivibrator circuit and the reference ground potential connection.

3. The frequency divider circuit of claim 1, wherein the third switching device is arranged between the transistors in the third multivibrator circuit and the supply connection, and wherein the second switching device is arranged between the transistors in the fourth multivibrator circuit and the reference ground potential connection.

4. The frequency divider circuit of claim 1, further comprising:

a first clock input configured to receive a first clock signal; and a second clock input configured to receive a second clock signal, wherein the first clock input is coupled to the first and fourth switching devices, and the second clock input is coupled to the second and third switching devices.

5. The frequency divider circuit of claim 1, wherein at least one of the multivibrator circuits comprises a first and a second transistor, whose source connections are connected at a common circuit node and whose control connections are connected to drain connections of the first and second transistors, thereby forming a cross-coupling.

6. The frequency divider circuit of claim 4, wherein the first and the fourth switching devices each comprise at least one switching transistor having a control connection connected to the first clock input.

7. The frequency divider circuit of claim 4, wherein the second and the third switching devices each comprise at least one switching transistor having a control connection connected to the second clock input.

8. The frequency divider circuit of claim 7, wherein the at least one switching transistor in is of the same conductance type as the transistors in the multivibrator circuit which are connected to the at least one switching device.

9. The frequency divider circuit of claim 1, wherein at least one of the inverters comprises two series-connected transistors of different conductance type, whose control connections form the input of the inverter, and a tap between the two series-connected transistors forms the output of the inverter.

10. The frequency divider circuit of claim 9, wherein one of the two transistors in the at least one inverter is of the same conductance type as that switching transistor in the switching device which is connected thereto.

11. The frequency divider circuit of claim 9, wherein one of the two transistors in the at least one inverter is of the same conductance type as those transistors in the multivibrator circuit which are connected by means of the first transistor to the switching device.

* * * * *